(12) United States Patent
Noda et al.

(10) Patent No.: US 7,556,839 B2
(45) Date of Patent: Jul. 7, 2009

(54) METHOD OF MANUFACTURING SEMICONDUCTOR DEVICE AND APPARATUS FOR PROCESSING SUBSTRATE

(75) Inventors: Takaaki Noda, Toyama (JP); Kenichi Suzaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/587,500

(22) PCT Filed: Mar. 28, 2005

(86) PCT No.: PCT/JP2005/005699

§ 371 (c)(1),
(2), (4) Date: Jul. 27, 2006

(87) PCT Pub. No.: WO2005/093799

PCT Pub. Date: Oct. 6, 2005

(65) Prior Publication Data

US 2007/0178669 A1 Aug. 2, 2007

(30) Foreign Application Priority Data

Mar. 29, 2004 (JP) .............................. 2004-094488

(51) Int. Cl.
*C23C 16/00* (2006.01)
*C23C 16/22* (2006.01)
(52) U.S. Cl. .............................. 427/248.1; 427/255.23; 427/255.28; 427/255.38; 427/255.395
(58) Field of Classification Search ........................ None
See application file for complete search history.

(56) References Cited

U.S. PATENT DOCUMENTS 5,963,834 A * 10/1999 Hatano et al. ................ 438/680
6,171,104 B1 1/2001 Saito et al.
2003/0077920 A1 4/2003 Noda et al.
2003/0232514 A1 * 12/2003 Kim et al. .................... 438/791

FOREIGN PATENT DOCUMENTS

| JP | A 2000-058543 | 2/2000 |
| JP | A 2001-234345 | 8/2001 |
| JP | A-2001-250818 | 9/2001 |
| JP | A 2003-178992 | 6/2003 |
| JP | A-2003-289069 | 10/2003 |
| JP | A 2004-281832 | 10/2004 |

* cited by examiner

*Primary Examiner*—Fred J. Parker
*Assistant Examiner*—Kelly M Stouffer
(74) *Attorney, Agent, or Firm*—Oliff & Berridge, PLC

(57) ABSTRACT

A process for producing a semiconductor device, in which in the formation of a boron doped silicon film from, for example, monosilane and boron trichloride by vacuum CVD technique, there can be produced a film excelling in inter-batch homogeneity with respect to the growth rate and concentration of a dopant element, such as boron. The process includes the step of performing the first purge through conducting at least once of while a substrate after treatment is housed in a reaction furnace, vacuuming of the reaction furnace and inert gas supply thereto and the steps of performing the second purge through conducting at least once of after carrying of the substrate after treatment out of the reaction furnace, prior to carrying of a substrate to be next treated into the reaction furnace and while at least no product substrate is housed in the reaction furnace, vacuuming of the reaction furnace and inert gas supply thereto.

11 Claims, 6 Drawing Sheets

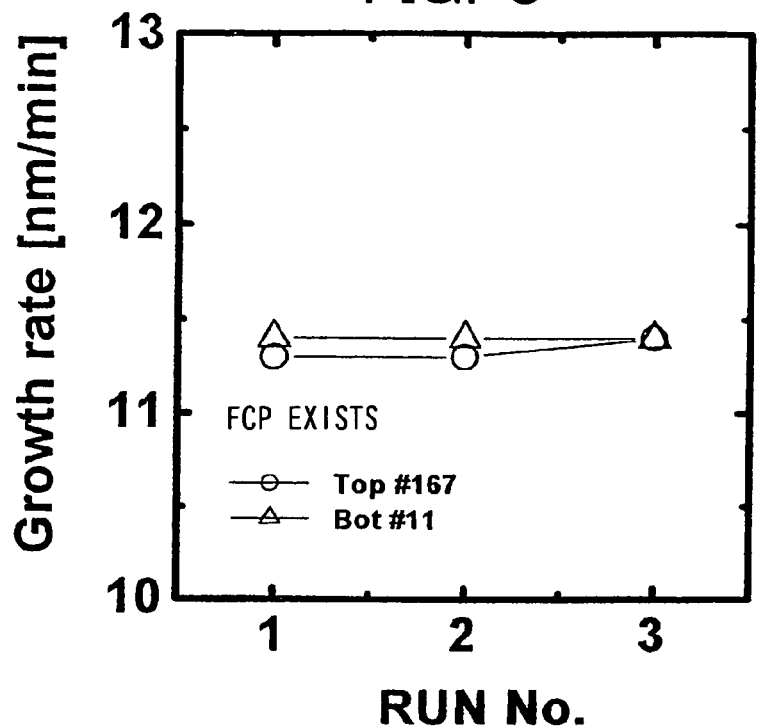
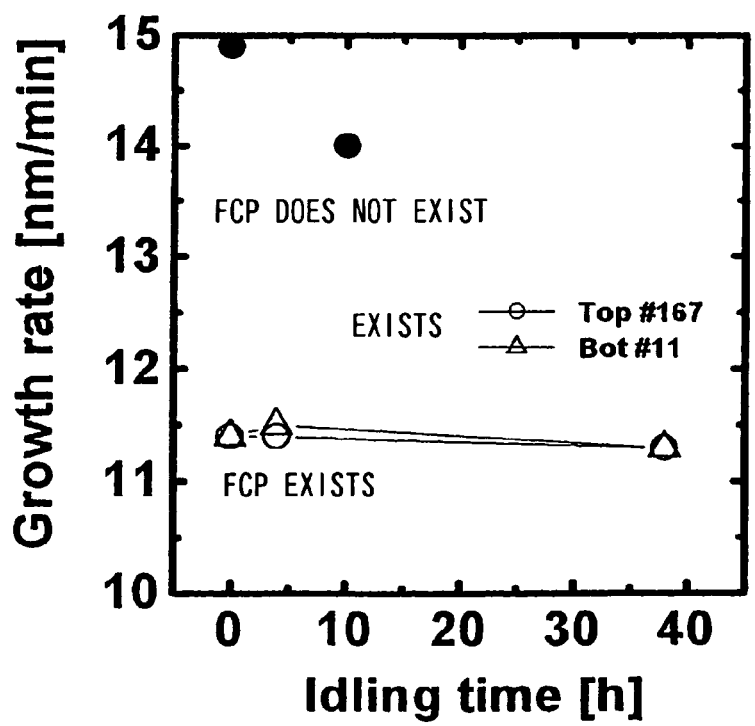

METHOD OF MANUFACTURING SEMICONDUCTOR DEVICE AND APPARATUS FOR PROCESSING SUBSTRATE

TECHNICAL FIELD

The present invention relates to a method of manufacturing a semiconductor device.

BACKGROUND ART

In a process of manufacturing the semiconductor device such as IC and LSI, there is performed the fact that a thin film is formed on a substrate by a reduced pressure CVD method (Chemical Vapor Deposition method). As one of such film forming methods, there is implemented the fact that a silicon film having been doped with boron is formed by the reduced pressure CVD method. Hitherto, in order to dope the boron to the silicon film, there has been used diborane. In this case, by introducing a gas from a furnace body lower part under a state that, in a reaction furnace, plural wafers have been stack-supported vertically in a boat to thereby cause the gas to vertically ascend, if there is used a reduced pressure CVD apparatus which forms the thin film on the wafer by a heat CVD method while using that gas, in-face homogeneities of a film thickness and a resistivity have been as bad as 10-20% in whole regions from a bottom region (lower part region) to a top region (upper part region) in the CVD apparatus.

There is known the fact that the above film thickness in-face homogeneity is greatly improved by using boron trichloride instead of the diborane and there is obtained such a boron-doped polycrystalline silicon film that its film thickness in-face homogeneity is 1% or less in the whole regions (refer to Patent Document 1).

Patent Document 1: JP-A-2003-178992

DISCLOSURE OF THE INVENTION

Problems that the Invention is to Solve

However, in the case where the film having been doped with the boron is formed by using the boron trichloride for the silicon, if there is an interval between a film formation run (film formation batch processing) and a next film formation run, there is a problem that a B (boron) concentration and a growth rate decrease in the next film formation run and, in this case, it has been necessary that, in the next film formation run, the film formation run is once implemented without a product being put in and thereafter the film formation run is implemented with the product being continuously put in.

However, if the film formation run is once implemented without the product being put in, an efficiency of a product processing becomes bad and, even if the run is implemented taking a time, the B concentration and the growth rate are not necessarily obtained with a good reproducibility.

An object of the invention exists in providing a method of manufacturing a semiconductor device, in which, in such a case that the boron-doped silicon film is formed by the reduced pressure CVD method by using monosilane and the boron trichloride for instance, it is possible to produce a film whose inter-batch homogeneities of a concentration and a growth rate of an element doped like the boron for instance are good.

Means for Solving the Problems

In order to solve the above problems, a 1st characteristic of the invention exists in a method of manufacturing a semiconductor device, comprising the steps of: loading a substrate into a reaction furnace, performing in the reaction furnace a processing to the substrate, performing, under a state that the substrate after the processing has been accommodated in the reaction furnace, a 1st purge by performing an evacuation and a supply of an inert gas to the reaction furnace by more than at least one time, unloading the substrate after the processing out of the reaction furnace, and performing, after the substrate after the processing has been unloaded out of the furnace, before a substrate to be processed next is loaded into the reaction furnace, and under a state that at least a product wafer is not accommodated in the reaction furnace, a 2nd purge by performing the evacuation and the supply of the inert gas to the reaction furnace by more than at least one time, wherein a pressure change quantity in the reaction furnace per unit time in the 2nd purge step has been made larger than a pressure change quantity in the reaction furnace per unit time in the 1st purge step.

Desirably, the pressure change quantity in the reaction furnace per unit time in the 2nd purge step is made larger than 30 Pa/second and 500 Pa/second or smaller. Further, desirably, in a method of manufacturing a semiconductor device according to claim 1, a difference between a maximum pressure and a minimum pressure in the reaction furnace in the 2nd purge step is made larger than a difference between a maximum pressure and a minimum pressure in the reaction furnace in the 1st purge step. Further, desirably, in the 1st purge step and the 2nd purge step, the evacuation and the supply of the inert gas are repeated by plural times, and a cycle of the evacuation and the supply of the inert gas in the 2nd purge step is made shorter than a cycle of the evacuation and the supply of the inert gas in the 1st purge step. Further, desirably, in the 1st purge step and the 2nd purge step, the evacuation and the supply of the inert gas are repeated by plural times, and a cycle number of the evacuation and the supply of the inert gas in the 2nd purge step is made more than a cycle number of the evacuation and the supply of the inert gas in the 1st purge step. Further, desirably, in the 1st purge step and the 2nd purge step, the evacuation and the supply of the inert gas are repeated by plural times, in the 1st purge step there is supplied the inert gas into the reaction furnace under a state that an exhaust valve, which has been provided in an exhaust line for exhausting an inside of the reaction furnace, has been opened, and in the 2nd purge step there is supplied the inert gas into the reaction furnace under a state that the exhaust valve has been closed. Further, desirably, the 1st purge step is performed under a state that a support, which has supported the substrate, has been accommodated in the reaction furnace, and the 2nd purge step is performed under a state that a support, which does not support at least a product substrate, has been accommodated in the reaction furnace. Further, desirably, the 1st purge step is performed under a state that a support, which has supported the substrate, has been accommodated in the reaction furnace, and the 2nd purge step is performed under a state that a support, which has supported a dummy substrate without supporting a product substrate, has been accommodated in the reaction furnace. Further, desirably, in the substrate processing step there is used a gas containing boron. Further, desirably, in the substrate processing step there is formed a boron-doped silicon film on the substrate. Further, desirably, in the substrate processing step there are used monosilane ($SiH_4$) and boron trichloride ($BCl_3$). Further, desirably, the 2nd purge step is performed each time in every time the processing to the substrate is performed.

A 2nd characteristic of the invention exists in a method of manufacturing a semiconductor device, comprising the steps of: charging a substrate to a support, loading the support having been charged with the substrate into a reaction furnace, performing in the reaction furnace a processing to the substrate, unloading the support, which has supported the substrate after the processing, from the reaction furnace, discharging, after the support has been unloaded, the substrate after the processing from the support, loading, after the substrate after the processing has been discharged, the support into the reaction furnace without charging at least a product substrate to the support, and performing a purge by performing, under a state that the support not charged with at least the product substrate has been accommodated in the reaction furnace, an evacuation and a supply of an inert gas to the reaction furnace by more than at least one time without introducing a reactive gas into the reaction furnace.

Desirably, the purge step is performed under a state that a dummy substrate has been supported without supporting the product substrate to the support. Further, desirably, the purge step is performed each time in every time the processing to the substrate is performed. Further, desirably, a pressure change quantity in the reaction furnace per unit time in the purge step is made larger than 30 Pa/second and 500 Pa/second or smaller.

In the 2nd purge step or the purge step, there suffices if an FCP (Fast Cycle Purge) is used. The FCP is a method of strongly purging an inside of the reaction furnace by generating a sharp pressure fluctuation by opening/closing a main valve in a short cycle in the reaction furnace of the reduced pressure CVD apparatus. If this FCP is used, it is possible to remove, e.g., boron having adhered to inside of the reaction furnace, a boat, a dummy wafer and the like to thereby uniformize an in-furnace state before a film formation and, by this, it is possible to suppress fluctuations of a boron concentration and a growth rate after the film formation.

A 3rd characteristic of the invention exists an apparatus for processing a substrate, comprising: a reaction furnace for processing the substrate, a gas supply line for supplying a gas into the reaction furnace, a loading/unloading device for transporting the substrate into and from the reaction furnace, and a controller which controls so as to perform, under a state that the substrate after the processing has been accommodated in the reaction furnace, a 1st purge by performing an evacuation and a supply of an inert gas to the reaction furnace by more than at least one time, which controls so as to perform, after the substrate after the processing has been unloaded out of the reaction furnace, before a substrate to be processed next is loaded into the reaction furnace, and under a state that at least a product substrate is not accommodated in the reaction furnace, a 2nd purge by performing the evacuation and the supply of the inert gas to the reaction furnace by more than at least one time, and additionally which controls such that a pressure change quantity in the reaction furnace per unit time in the 2nd purge is made larger than a pressure change quantity in the reaction furnace per unit time in the 1st purge.

In the substrate processing apparatus of the invention, it is possible to implement various methods having been mentioned above.

BRIEF DESCRIPTION OF THE DRAWINGS

FIG. 6 is a diagram showing a change in a growth rate in the continuous three runs in the embodiment according to the invention.

FIG. 7 is a diagram showing inter-batch idling time dependencies of the growth rate in the embodiment according to the invention and the comparison example.

BEST MODE FOR CARRYING OUT THE INVENTION

Next, an implementation mode of the invention is explained on the basis of the drawings.

As a preliminary consideration before the invention is made, a cause of a boron concentration fluctuation between batches is considered as follows. That is, since a desorption quantity, of boron before the film formation, from a reaction furnace inner wall face, a boat surface and the like becomes different by an idling time between the batches, there is considered the fact that a boron quantity doped at a film formation time changes and thus the boron concentration fluctuates.

Further, there is considered the fact that, in the present implementation mode since a film growth occurs by a catalyst effect of the boron, the growth rate fluctuates by the fact that the boron concentration fluctuates. In order that the desorption quantity, of the boron before the growth, from the reaction furnace inner wall face, the boat surface and the like is made as constant as possible, it is considered to flow the boron trichlodide in a certain constant quantity into the furnace before the film formation, or to oxidation-coat a furnace inside before the film formation. However, in the former there is an anxiety that the boron segregates in an interface between the substrate and the film, and in the latter there is an anxiety that a cleaning is hindered by the wall face having been oxidized at an in-furnace gas cleaning time, so that both cannot be said a desirable policy. Whereupon, as a result of earnest studies, the present inventor has found out a strong purge method called an FCP (Fast Cycle Purge) capable of solving these problems. It has been understood that, by always performing this FCP before the film formation, the desorption of the boron from the reaction furnace inner wall face, the boat surface and the like is promoted, and the desorption quantity, of the boron before the film formation, from the reaction furnace inner wall face, the boat surface and the like can be stabilized, so that it is possible to improve a stability of the boron concentration and the growth rate between the batches.

The implementation mode of the invention is one having been made on the basis of the consideration like this.

Figure 1:
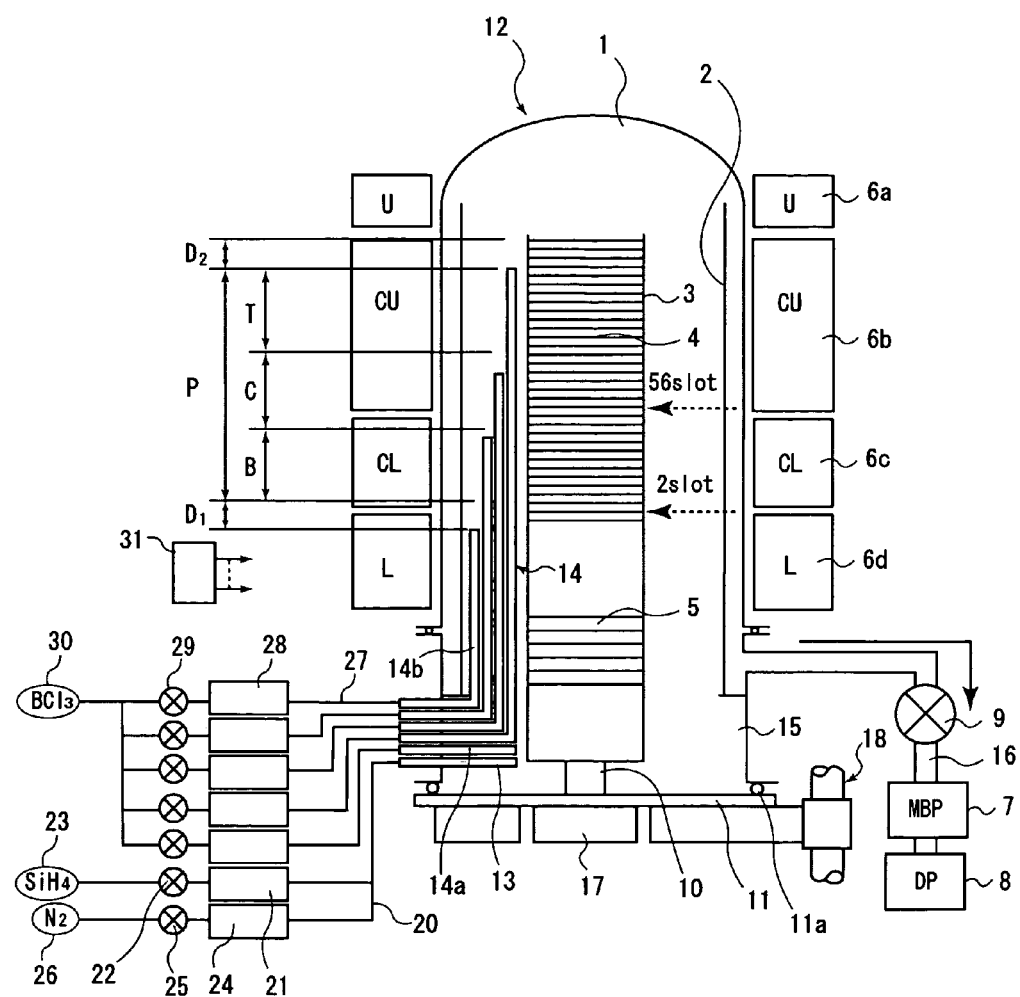
FIG. 1 is a schematic view showing an apparatus for processing a substrate according to an implementation mode of the invention.

In FIG. 1, there is shown a structural, schematic view of a batch system longitudinal type reduced pressure CVD apparatus of a hot wall system as an apparatus for processing a substrate of the invention. This reduced pressure CVD apparatus is one in which the monocilane ($SiH_4$) and the boron trichloride ($BCl_3$) are used as a reaction gas and, by introducing the gas from the furnace body lower part under the state that, in the reaction furnace, plural wafers have been vertically stack-supported in the boat as a support to thereby cause the gas to vertically ascend, there is formed a boron-doped silicon thin film, i.e., a boron-doped amorphous silicon thin film or a boron-doped polycrystalline silicon thin film, on the wafer by the heat CVD method while using that gas.

In an inside of heaters 6a-6d having been separated to four zones, which constitute a hot wall furnace and heat a wafer 4 as the substrate, there are installed a quartz-made reaction pipe that is an outer casing of a reaction furnace 12, i.e., outer tube 1, and an inner tube 2 inside the outer tube 1 with their axes being made vertical. There is adapted such that between the tubes of these two kinds can be evacuated by using a mechanical booster pump 7 and a dry pump 8. Accordingly, the reaction gas introduced to an inside of the inner tube 2 vertically ascends the inside of the inner tube 2, descends between the tubes of the two kinds, and is exhausted. A quartz-made boat 3 in which the plural wafers 4 have been vertically stack-charged with their centers being aligned is installed in the inner tube 2. When the wafer 4 has been exposed to the reaction gas, the thin film is formed on the wafer 4 by reactions in a gas phase and in a wafer 4 surface. Incidentally, a heat insulation plate 5 having been charged in a region, of the boat 3, lower than a region in which the wafers 4 have been charged is one for homogenizing a temperature in a position range in which the wafers 4 exist. Further, in FIG. 1, 10 is a boat rotation shaft, and it is connected to a rotation mechanism 17. Further, 11 is a stainless-made lid (seal cap), and it is connected to a boat elevator 18 as a transporting-in/out device (ascent/descent device). There is adapted such that the boat 3, the rotation shaft 10, the lid 11 and the rotation mechanism 17 are monolithically ascended/descended by this boat elevator 18, and the boat 3 is loaded into or unloaded from the reaction furnace 12. The lid 11 closely adheres to a stainless-made furnace mouth manifold 15 supporting the outer tube 1 and the inner tube 2 through an O-ring 11a as a seal member, thereby sealing an inside of the reaction furnace 12. Further, there is adapted such that the boat 3 is rotated in the reaction furnace 12 by the rotation mechanism 17 through the rotation shaft 10.

Incidentally, in the boat 3, slots each of which supports the wafer 4 are provided by 172. For example, the slots up to 10th counted from the lowermost slot constitute a lower dummy region D1, and the dummy wafer 4 is supported by the slot belonging to this lower dummy region D1. Further, for example, the slots from 11th to 167th constitute a product wafer region P, and the product wafer 4 is supported by the slot belonging to this product wafer region P. Further, for example, the slots from 168th to 172nd constitute an upper dummy region D2, and the dummy wafer 4 is supported by the slot belonging to this upper dummy region D2. Incidentally, below the wafer arrangement regions (D2, P, D1) of the boat 3, there are provided plural slots supporting the plural heat insulation plates 5, and the heat insulation plate 5 is disposed in an underside than the heater 6d corresponding to an L zone among later-mentioned heater zones having been divided into four. Further, in FIG. 1, a top region T, a center region C, and a bottom region B denote respectively a region in which there exist the product wafers 4 of the slots from 129th to 167th, a region in which there exist the product wafers 4 of the slots from 37th to 128th, and a region in which there exist the product wafers 4 of the slots from 11th to 36th. Further, among the heater zones having been divided into four, the lowermost L (Lower) zone (corresponding to the heater 6d) corresponds to a region, in an underside than the 1st slot, in which the wafer scarcely exists, a CL (Center Lower) zone (corresponding to the heater 6c) of the second from below corresponds to a region in which the dummy wafer 4 and the product wafer 4 of the slots from 2nd to 56th coexist, a CU (Center Upper) zone (corresponding to the heater 6b) of the third from below, i.e., the second from above, corresponds to a region in which the product wafer 4 and the dummy wafer 4 of the slots from 57th to 172nd coexist, and an uppermost, i.e., the fourth from below, U (Upper) zone (corresponding to the heater 6a) corresponds to a region, in an upside than the last-mentioned region, in which no wafer exists.

A nozzle (straight nozzle) 13 made of quartz for instance, which supplies a monocilane gas ($SiH_4$), is provided in the furnace mouth manifold 15 below a region opposite to the heaters and below the reaction pipe. As to a nozzle 14 made of quartz for instance, which supplies a boron trichloride gas ($BCl_3$), ones whose lengths differ are installed in the reaction furnace 12 by plural pieces, it is possible to midway-supply the boron trichloride from plural places, and it is possible to control a partial pressure of the boron trichloride gas ($BCl_3$) in each place in the reaction furnace 10. That is, there is constituted such that the quartz nozzle 14 supplying the boron trichloride gas ($BCl_3$) is provided by plural pieces, here five pieces in total, among them one nozzle (straight nozzle) 14a) is provided, together with the nozzle 13 supplying the monocilane gas ($SiH_4$), in the furnace mouth manifold 15 below the region opposite to the heaters and below the reaction pipe, and other four nozzles (L-shaped nozzles) 14b pass through the above furnace mouth manifold and their respective jet ports are provided respectively in the same interval so as to correspond to the 30th slot, the 70th slot, the 110th slot and the 150th slot, thereby being capable of midway-supplying the boron trichloride from plural places in a vertical direction within the reaction furnace 10.

Incidentally, as to the straight nozzle 13 supplying the monocilane gas ($SiH_4$) and the straight nozzle 14a supplying the boron trichloride gas ($BCl_3$), there is constituted such that their respective jet ports are opened toward a direction parallel to a wafer surface, i.e., a horizontal direction, thereby jetting the respective gases toward the direction parallel to the wafer surface, i.e., the horizontal direction. Further, there is constituted such that gas jet ports of the plural L-shaped nozzles 14b supplying the boron trichloride gas ($BCl_3$) are opened toward a direction perpendicular to the wafer surface, i.e., a vertically upward direction, thereby jetting the gas toward the direction perpendicular to the wafer surface, i.e., the vertical direction.

Further, the nozzle 13 is connected to a gas line 20. This gas line 20 is bifurcated, and one of this bifurcated gas line is connected to a monocilane gas ($SiH_4$) source 23 through a mass flow controller 21 as a flow rate control means and a valve 22. Further, the other of the bifurcated gas line 20 is connected to a nitrogen gas ($N_2$) source 26 through a mass flow controller 24 as the flow rate control means and a valve 25. The five nozzles 14 are connected to gas lines 27 having been separated into five. This gas line 27 is connected to a boron trichloride gas ($BCl_3$) source 30 through a mass flow controller 28 as the flow rate control means and a valve 29.

The above-mentioned mechanical booster pump 7 and dry pump 8 are provided in an exhaust pipe 16 whose one end has been connected to the furnace mouth manifold 15. Additionally, in this exhaust pipe 16 there is provided a main valve 9. For this main valve 9 there is used an APC (automatic pressure control) valve, and there is adapted such that its opening is automatically adjusted such that a pressure in the reaction furnace 12 becomes a predetermined value.

Incidentally, a controller 31 as a control means controls heating temperatures of the heaters 6a-6d, an open/close of the main valve 9, drives of the mechanical booster pump 7 and the dry pump 8, a drive of the boat elevator 18, a drive of the rotation mechanism 17, openings of the mass flow controllers 21, 24, 28, an open/close of each of the valves 22, 25, 29, and the like.

Figure 2:
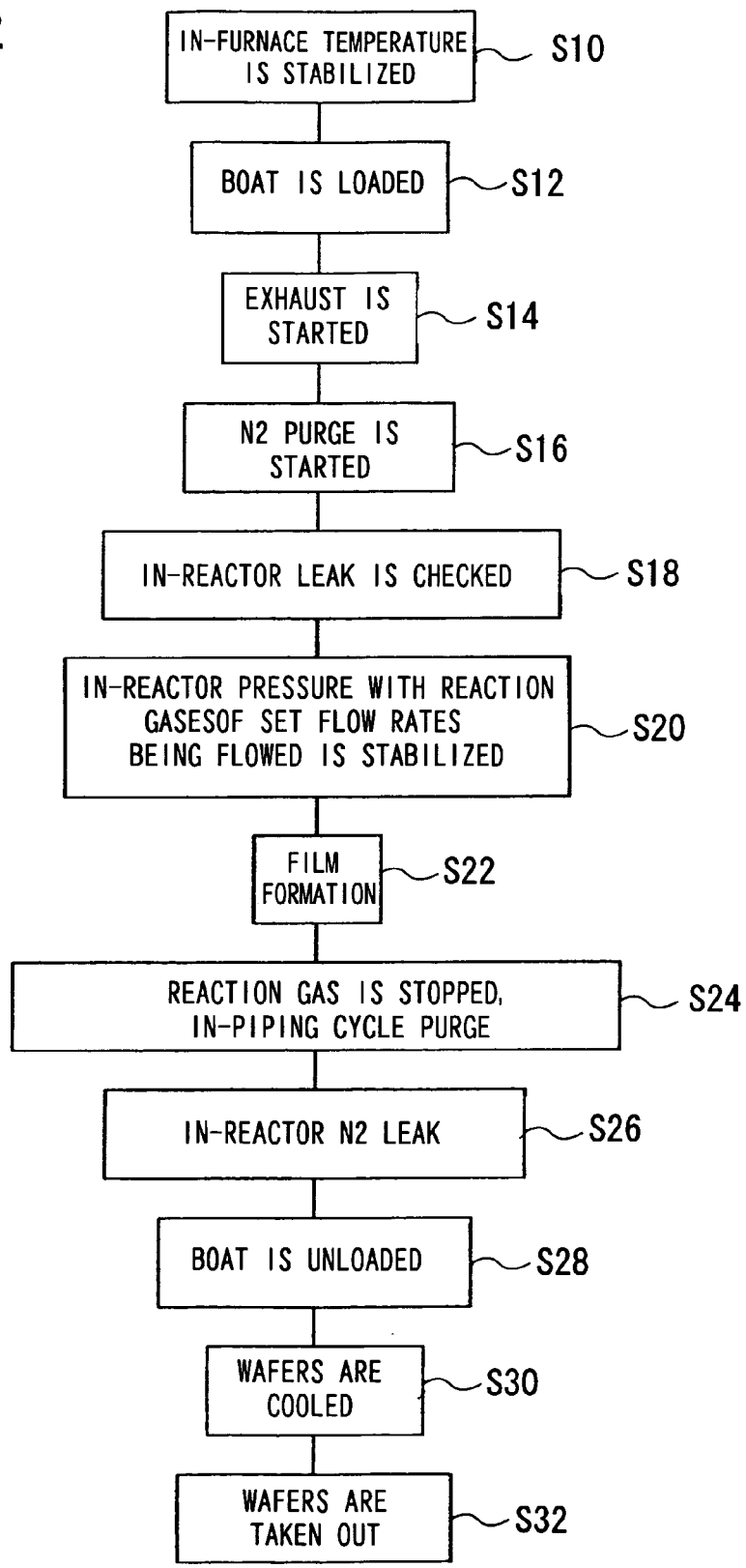
FIG. 2 is a flowchart showing film formation procedures in a method of manufacturing a semiconductor device according to the implementation mode of the invention.

Next, as one process in processes of manufacturing the semiconductor device by using the above substrate processing apparatus, there is explained about a film formation method which forms the boron-doped silicon film on the substrate. Film formation procedures are shown in FIG. 2. Incidentally, in the following explanations, an operation of each part constituting the substrate processing apparatus is controlled by the controller 31. After the inside of the reaction furnace 12 has been first stabilized to a film formation temperature in a step S10, the boat 3 having been charged with the wafers 4 is loaded (inserted) into the reaction furnace 12 in a step S12. Next, in a step S14, the inside of the reactor (reaction furnace 12) is exhausted and, in a next step S16, an $N_2$ purge is performed in order to desorb a moisture and the like which have been adsorbed to the boat 3 and the tubes 1, 2. After an in-reactor (reaction furnace 12) leak check has been performed in a next step S18, flow rates of the monocilane and the boron trichloride are set in a next step S20 and a pressure is stabilized with the gases being flowed into the reaction furnace 12 and, in a next step S22, on the wafer 4 there is performed a film formation of the boron-doped silicon film, i.e., the boron-doped amorphous silicon film or the boron-doped polycrystalline silicon film. If the film formation has terminated, in a next step S24, an inside of the reaction pipe and an inside of a piping are cycle-purged by $N_2$ (1st purge step).

This 1st purge step is a normal cycle purge (Normal Cycle Purge: hereafter mentioned as NCP), and implements the cycle purge only by a supply and a stop of the $N_2$ gas by opening and closing the valve 25 having been mentioned above with the main valve 9 being opened intact. After the NCP has been implemented by three—several cycles for instance in the step S24, it proceeds to a step S26. Purge conditions of the NCP are as follows for instance.

Time per one cycle: 4-6 min
Evacuating time per one cycle: 2-3 min
$N_2$ supply time per one cycle: 2-3 min
Total time: 12-18 min
Minimum pressure (reach pressure when evacuating): 0.05-1 Pa
Maximum pressure (reach pressure when supplying $N_2$): 20-100 Pa
Cycle number: 3-several times
$N_2$ supply quantity: 0.5-1 slm
Pressure change quantity per unit time: 7 Pa/second or less In a next step S26, the inside of the reactor is returned up to an atmospheric pressure by the $N_2$. If having returned to the atmospheric pressure, the boat 3 is unloaded in a next step S28, and the wafers 4 are naturally cooled in a next step S30. Finally, the wafers 4 are taken out of the boat 3 in a step S32.

Figure 3:
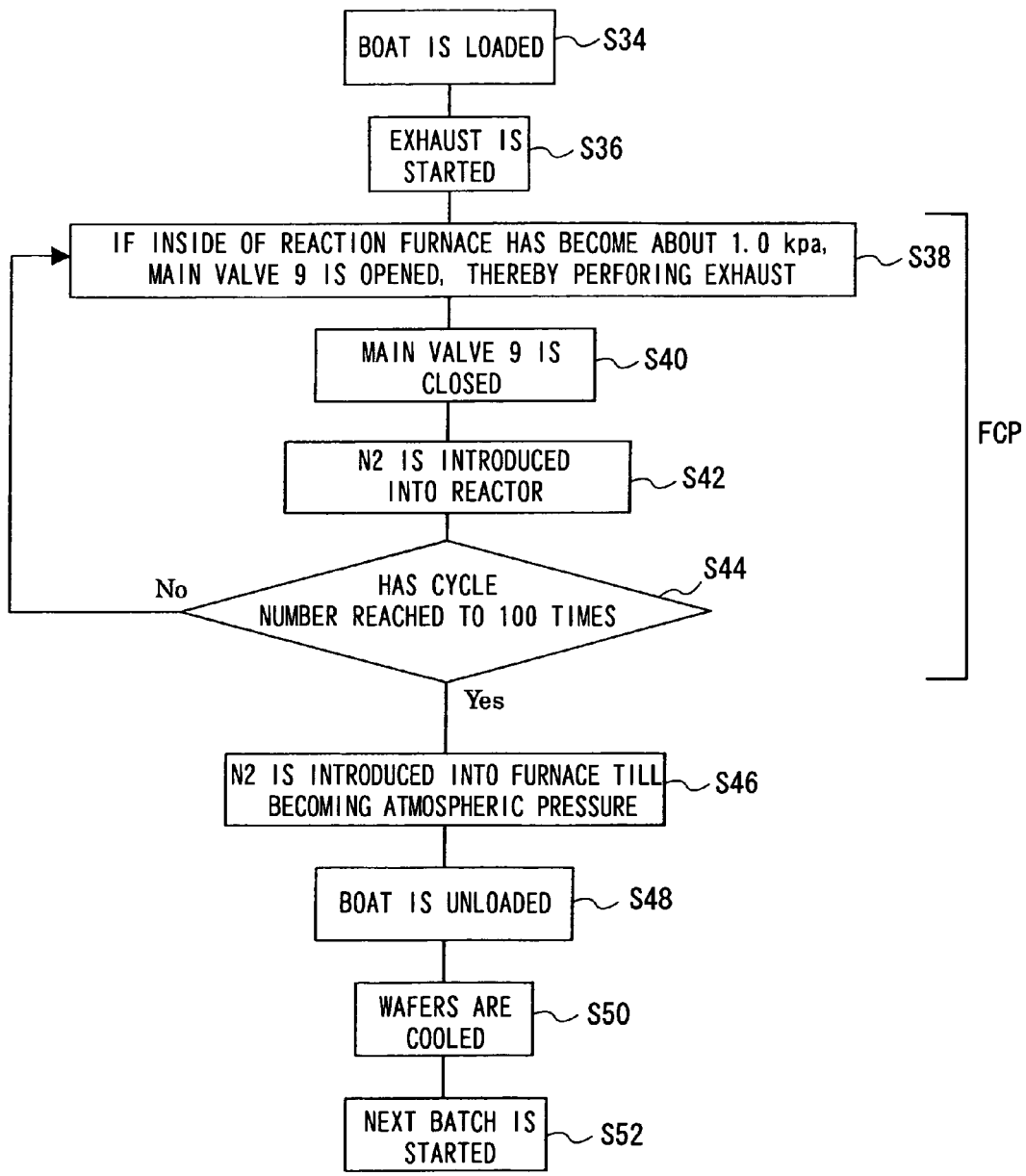
FIG. 3 is a flowchart showing FCP procedures in the method of manufacturing the semiconductor device according to the implementation mode of the invention.

Next, there is explained about a method of purging the inside of the reaction furnace after a film formation termination by the FCP. FCP procedures are shown in FIG. 3. After the film formation having been shown in FIG. 2 has terminated, in a step S34, the boat 3 not charged with the product wafers is loaded (inserted) into the reaction furnace 12 again. In this case, the dummy wafer may be removed from the boat 3, or may be being charged in the boat 3. Next in a step S36, the evacuation is started by driving the mechanical booster pump 7 and the dry pump 8. If the pressure in the inside of the reactor (reaction furnace 12) has become a predetermined value, e.g., about 1.0 kPa, in a next step S38 the main valve 9 is opened instantaneously, thereby performing the exhaust. In a next step S40, the main valve 9 is closed and, in a next step S42, the $N_2$ gas is introduced again into the reactor (reaction furnace 12). In a next step S44, it is judged whether or not a cycle of the steps S38-S42 has reached to a predetermined value, e.g., 100 times and, in a case where it does not reach to the predetermined value, it returns to the step S38 and this cycle is repeated till it reaches to the predetermined value. In a case where the steps of the steps S38-s42 have reached the predetermined value, it proceeds to a next step S46. In the step S46, the $N_2$ is introduced into the reaction furnace 12 till the pressure in the reaction furnace 12 becomes the atmospheric pressure. In a next step S48, the boat 3 not charged with the product wafers is unloaded and, in a case where the boat 3 has been charged with the dummy wafers, the dummy wafers are cooled in a next step S50 and, in a next step S52, there is started a next batch, i.e., the film formation having been shown in FIG. 2.

Incidentally, desirable purge conditions of the FCP are as follows.

Time per one cycle: 0.5-2 min
Evacuating time per one cycle: 0.25-1 min
$N_2$ supply time per one cycle: 0.25-1 min
Total time: 20-100 min
Minimum pressure (reach pressure when evacuating): 0.05-1 Pa
Maximum pressure (reach pressure when supplying $N_2$): 1000-1200 Pa
Cycle number: 10-200 times
$N_2$ supply quantity: 0.5-1 slm
Pressure change quantity per unit time: 30 Pa/second-500 Pa/second, desirably 100 Pa/second-500 Pa/second Incidentally, if the pressure change quantity per unit time exceeds 500 Pa/second, loads on the reaction furnace and the pump become large, so that it is difficult to implement in regard to an interlock of the substrate processing apparatus.

Like this, in comparison with the normal cycle purge, the FCP is characterized in that the pressure change quantity per unit time is very large (rapid).

Figure 8:
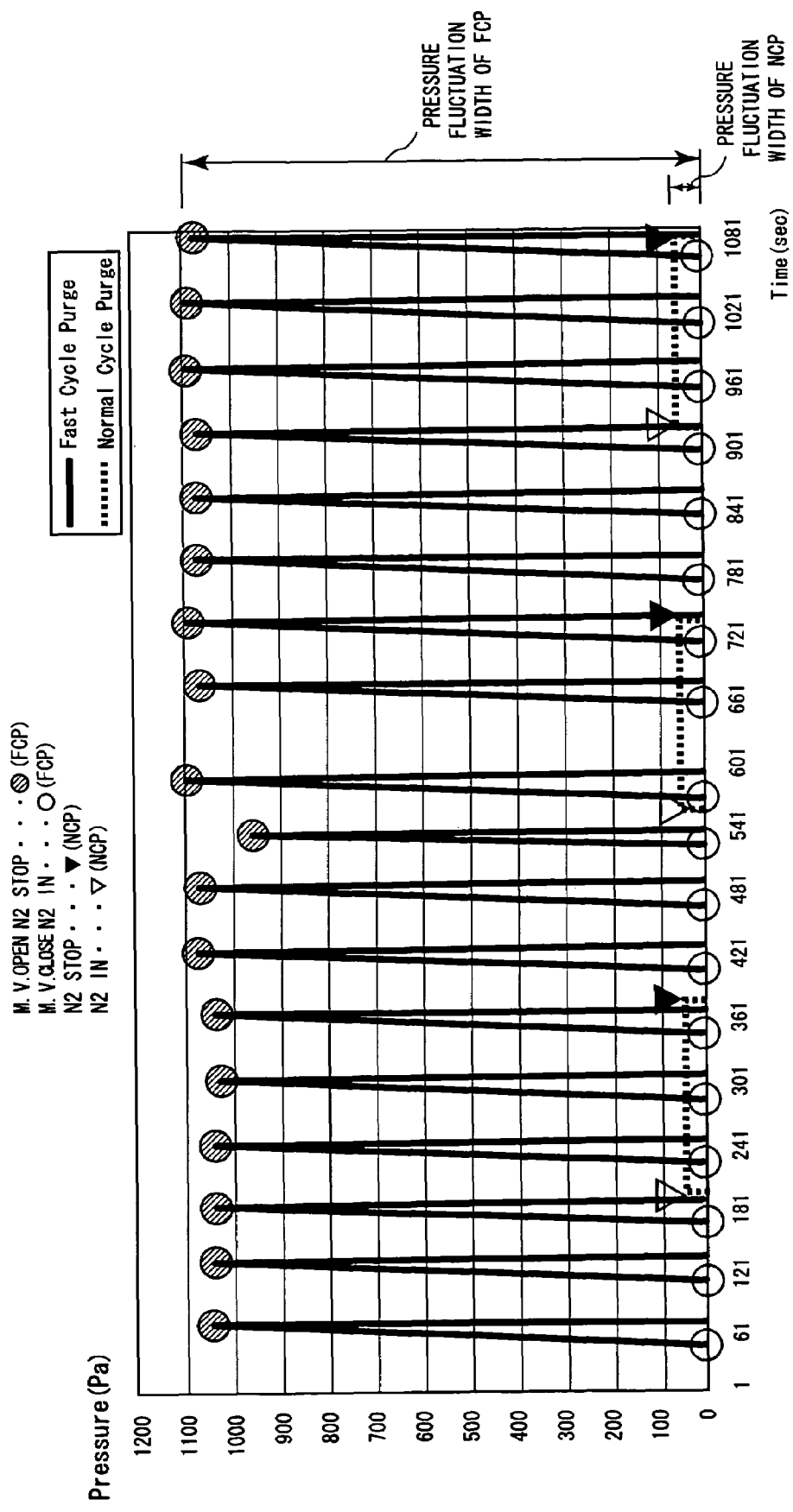
FIG. 8 is a diagram in which a normal cycle purge and an FCP have been compared in the method of manufacturing the semiconductor device according to the implementation mode of the invention.

In FIG. 8 there is shown a graph indicating the pressure change quantities in the reaction furnace, with respect to a time elapse, of the FCP having been shown in the steps S38-S44 and the NCP having been shown in the step S24 while being compared. An abscissa of the graph indicates the time elapse (second), and an ordinate the pressure (Pa) in the reaction furnace, respectively. In the drawing, M. V. OPEN, N2 STOP means an operation stopping the supply of the N2 under a state that the main valve has been opened in the FCP, and it is shown by a circle in which a hatching has been applied. Further, in the drawing, M. V. CLOSE, N2 IN means an operation supplying the N2 under a state that the main valve has been closed, and it is shown by a white circle. Further, in the drawing, N2 STOP means an operation stopping the supply of the N2 in the NCP, and it is shown by a black reverse triangle. Further, in the drawing, N2 IN means an operation stopping the supply of the N2 in the NCP, and it is shown by a white reverse triangle. Further, a solid line indicates the pressure change in the FCP, and a dotted line the pressure change in the NCP, respectively. As mentioned above, the FCP performs the cycle purge by opening/closing the main valve (M. V.). On the other hand, the NCP performs the cycle purge by the supply/stop of the $N_2$ with the main valve being opened intact.

As understood also from FIG. 8, in the FCP, the pressure change quantity in the reaction furnace per unit time is large in comparison with the NCP. For example, in the NCP the pressure change quantity per unit time is in the order of 7

Pa/second in maximum, whereas in the FCP it is in the order of 500 Pa/second in maximum. Further, in the FCP a difference (pressure fluctuation width) between a maximum pressure and a minimum pressure is large in comparison with the NPC. For example, the pressure fluctuation width is 1000-1200 Pa in the FCP, whereas it is in the order of 20-100 Pa in the NCP. Further, in the FCP a cycle number is many in comparison with the NCP. For example, the cycle number is 10-200 times in the FCP, whereas it is 3-several times in the NCP.

As having been mentioned above, in comparison with the NCP, in the FCP since the pressure change quantity per unit time in the reaction furnace is large (the pressure change quantity per unit time of the FCP is 4-70 times or more of the NCP), a gas flow rate passing through the inside of the reaction furnace per unit time, i.e., a gas flow rate contributing to the purge, becomes large as well, so that a purge effect is overwelmingly large.

Especially, in the case where there is performed the process using the boron trichloride ($BCl_3$), if there is made so as to perform only the NCP, the $BCl_3$ exists abundantly in a form liable to desorb in a region extending from a bottom region B whose temperature is comparatively low to the furnace mouth part. The $BCl_3$ having been left like this becomes HCl on the occasion of the boat unloading and becomes a cause of corroding the furnace mouth part (the stainless-made manifold, the seal cap and the like), thereby exerting an influence on the growth rate of the boron-doped silicon film or the like in the next film formation run. That is, especially in the case where the process using the boron trichloride ($BCl_3$) is performed, a sufficient purge effect is not obtained by the NCP. Whereupon, in the above implementation mode, there is made so as to perform a strong purge called the FCP. By this, it is possible to sufficiently remove the $BCl_3$ liable to remain in the above low temperature part, and thus it is possible to make such that no influence is exerted on the substrate processing in the next film formation run.

Next, there are explained about an embodiment and a comparison example.

Embodiment

The boron-doped silicon thin film was formed by using the above-mentioned reduced pressure CVD apparatus and using the monocilane ($SiH_4$) and the boron trichloride ($BCl_3$) as the reaction gases. Every time the film formation processing was performed, the FCP was implemented.

The film formation processing was implemented with a total pressure in the reaction furnace 12 being made 66.5 Pa, an $SiH_4$ flow rate 0.2 slm, a $BCl_3$ flow rate 0.002 slm, and an in-furnace temperature 380-400° C.

The FCP was implemented with the maximum pressure (reach pressure when supplying $N_2$) being made 1200 Pa, the minimum pressure (reach pressure when evacuating) 0.1 Pa, the time per one cycle 1 min, a time during which the pressure is fluctuated from the maximum pressure to the minimum pressure 5 seconds, the cycle number 100 times, the total time 100 min, and an N2 supply quantity 1 slm.

Comparison Example

The film formation processing was performed similarly to the embodiment, and the FCP was not implemented.

Figure 4:
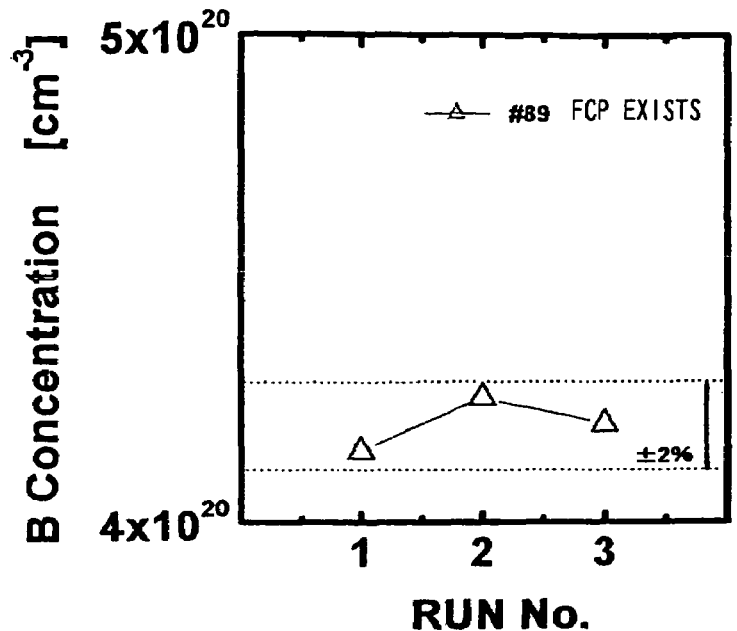
FIG. 4 is a diagram showing a change in a B concentration in continuous three runs in an embodiment according to the invention.

In FIG. 4, there is shown a batch (run) frequency dependency of a B concentration in the embodiment, i.e., a result having measured the boron (B) concentration in a continues 3-run about the product wafer having been mounted to the slot (#89) in the center region. There could be confirmed the fact that a fluctuation of the B concentration fell to less than 2% by implementing the FCP.

Figure 5:
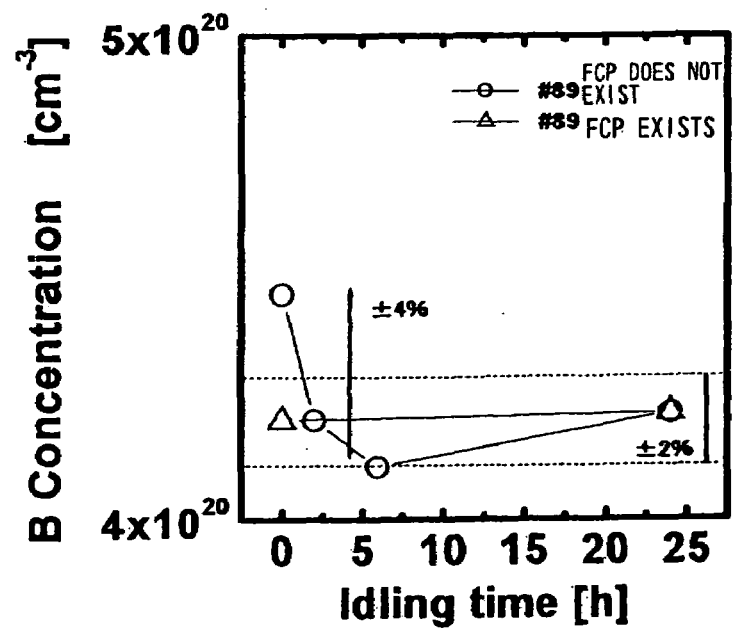
FIG. 5 is a diagram showing inter-batch idling time dependencies of the B concentration in the embodiment according to the invention and a comparison example.

In FIG. 5, there are shown inter-batch idle time dependencies of the B concentration in the embodiment and the comparison example. In the comparison example (the FCP does not exist), the B concentration sharply decreases in an idling of 2-6 hours, and its dispersion is about ±4% with the B concentration after a 24-hour idling being included as well. In contrast to this, in the embodiment (the FCP exists), a B concentration change falls to less than ±2% even after the 24-hour idling. From the results of FIG. 4 and FIG. 5, the fact is understood that, by implementing the FCP, it is possible to improve an inter-batch homogeneity of the B concentration.

In FIG. 6, there is shown a batch (run) frequency dependency of the growth rate of the boron-doped silicon thin film in the embodiment, i.e., results having measured changes in the growth rate in the continuous 3-run about the product wafers having been mounted to the slot (#167) in the top region and to the slot (#11) in the bottom region. There could be confirmed the fact that, by implementing the FCP, a fluctuation of the growth rate fell to less than 2%.

In FIG. 7, there are shown inter-batch idle time dependencies of the growth rate of the boron-doped silicon thin film in the embodiment and the comparison example. In the comparison example (the FCP does not exist), the growth rate more largely disperses by the inter-batch idle time, whereas in the embodiment (the FCP exists) the fluctuation of the growth rate scarcely exists even after the 24-hour idling, additionally even after a 38-hour idling. From the results of FIG. 6 and FIG. 7, the fact is understood that, by implementing the FCP, it is possible to improve an inter-batch homogeneity of the growth rate.

As having mentioned above, the FCP is liable to desorb the $BCl_3$ and a Cl component, which have adhered to the constitutional members in the reaction furnace, i.e., the boat, the dummy wafer, and additionally inner walls etc. of the reaction pipe, the manifold and the seal cap. Its reason is because, in the FCP since the $N_2$ is accumulated in the reaction furnace up to a high pressure and pulled instantaneously, the pressure change per unit time is large and a purge gas quantity becomes abundant as well, so that the purge effect becomes overwelmingly large.

Incidentally, although in the above implementation mode and embodiment there has been shown one having been applied to the reduced pressure CVD apparatus, the invention is not one limited this, and it can be generally applied to an apparatus using a gas containing the boron (B) with a boron dope diffusion apparatus being included, and can be applied also about an apparatus using a gas containing phosphorous (P), such as $PH_3$ for instance, other than the boron, a gas containing arsenic (As) such as $AsH_3$, and the like.

Like the above, although the invention is characterized by matters set forth in claims, additionally there are included implementation modes like the followings.

(1) An apparatus for processing a substrate, characterized by having a reaction furnace for processing the substrate, a supply means for supplying a processing gas into the reaction furnace, a transporting-in/out device for transporting the substrate into and from the reaction furnace, and a control means which controls so as to repeat—after the substrate has been transported out of the reaction furnace by the transporting-in/out device, before a substrate to be processed next is transported-in, and under a state that at least a product substrate does not exist in the reaction furnace—an evacuation and a supply of an inert gas with respect to the reaction furnace.

(2) An apparatus for processing a substrate, characterized by having a boat for charging the substrate, a reaction furnace for processing the substrate, a supply means for supplying a processing gas into the reaction furnace, a transporting-in/out device for transporting the boat into and from the reaction furnace, and a control means which controls so as to perform—after the boat has been transported out of the reaction furnace together with the substrate by the transporting-in/out device, before a substrate to be processed next is transported-in, and under a state that an empty boat not charged with at least a product substrate has been inserted into the reaction furnace—an evacuation and a supply of an inert gas with respect to the reaction furnace by more than at least one time.

INDUSTRIAL APPLICABILITY

The invention can be utilized in a method of manufacturing a semiconductor device, which has a process of processing a substrate.

The invention claimed is:

1. A method of manufacturing a semiconductor device, comprising the steps of:
    loading a substrate into a reaction furnace,
    processing the substrate in the reaction furnace,
    performing a $1^{st}$ purge in a state of the processed substrate in the reaction furnace by
        evacuating an inside of the reaction furnace through an exhaust line,
        supplying an inert gas into the reaction furnace,
        thereby changing a pressure in the reaction furnace,
    unloading the processed substrate from the reaction furnace, and
    performing, after the processed substrate is unloaded from the reaction furnace and before another substrate is loaded into the reaction furnace, a 2nd purge by
        evacuating the inside of the reaction furnace through the exhaust line,
        supplying the inert gas into the reaction furnace,
        thereby changing the pressure in the reaction furnace,
    wherein an amount of change in the pressure in the reaction furnace in the $2^{nd}$ purge step is larger than an amount of change in the pressure in the reaction furnace in the $1^{st}$ purge step; and
    in the $1^{st}$ purge and in the $2^{nd}$ purge, the evacuation of the inside of the reaction furnace and the supply of the inert gas into the reaction furnace are repeated two or more times; and
    in the $1^{st}$ purge, the evacuation of the inside of the reaction furnace and the supply of the inert gas into the reaction furnace are performed under a state that an exhaust valve, which is provided in the exhaust line, is open; and
    in the $2^{nd}$ purge, the evacuation of the inside of the reaction furnace is performed under the state that the exhaust valve is open and the supply of the inert gas into the reaction furnace is performed under a state that the exhaust valve is closed.

2. A method of manufacturing a semiconductor device according to claim 1, wherein a difference between a maximum pressure and a minimum pressure in the reaction furnace in the 2nd purge is larger than a difference between a maximum pressure and a minimum pressure in the reaction furnace in the 1st purge.

3. A method of manufacturing a semiconductor device according to claim 1, a cycle of the evacuation of the inside of the reaction furnace and the supply of the inert gas into the reaction furnace in the 2nd purge is shorter than a cycle of the evacuation of the inside of the reaction furnace and the supply of the inert gas into the reaction furnace in the 1st purge.

4. A method of manufacturing a semiconductor device according to claim 1, wherein a cycle number of the evacuation of the inside of the reaction furnace and the supply of the inert gas into the reaction furnace in the 2nd purge is greater than a cycle number of the evacuation of the inside of the reaction furnace and the supply of the inert gas into the reaction furnace in the 1st purge.

5. A method of manufacturing a semiconductor device according to claim 1, wherein in the substrate processing step a gas containing boron is used.

6. A method of manufacturing a semiconductor device according to claim 1, wherein in the substrate processing step a boron-doped silicon film is formed on the substrate.

7. A method of manufacturing a semiconductor device according to claim 1, wherein in the substrate processing step monosilane ($SiH_4$) and boron trichloride ($BCl_3$) are used.

8. A method of manufacturing a semiconductor device according to claim 1, wherein the 2nd purge step is performed each time in every time the processing to the substrate is performed.

9. A method of manufacturing a semiconductor device, comprising the steps of:
    charging a substrate to a support,
    loading the support charged with the substrate into a reaction furnace,
    processing the substrate in the reaction furnace,
    unloading the support, which supports the processed substrate from the reaction furnace,
    discharging the processed substrate from the support after the support which supports the processed substrate is unloaded from the reaction furnace,
    loading the support into the reaction furnace without charging a product substrate to the support, after the discharging the processed substrate from the support, and
    purging, under a state that the support not charged with the product substrate has been accommodated in the reaction furnace, by
        evacuating an inside of the reaction furnace through an exhaust line,
        supplying an inert gas into the reaction furnace,
        thereby changing a pressure in the reaction furnace,
    wherein, in the purging step, the evacuation of the inside of the reaction furnace and the supply of the inert gas into the reaction furnace are repeated two or more times, and, the evacuation of the inside of the reaction furnace is performed under a state that an exhaust valve, which is provided in the exhaust line, is open, and the supply of the inert gas into the reaction furnace is performed under a state that the exhaust valve is closed.

10. A method of manufacturing a semiconductor device according to claim 9, wherein the purging step is performed under a state that a dummy substrate is supported without supporting the product substrate to the support.

11. A method of manufacturing a semiconductor device according to claim 9, wherein the purge step is performed each time in every time the processing to the substrate is performed.

* * * * *